United States Patent [19]

Hiramoto et al.

[11] 4,243,743
[45] Jan. 6, 1981

[54] PHOTOSENSITIVE COMPOSITIONS

[75] Inventors: Hiroo Hiramoto, Otsu; Masuichi Eguchi, Kyoto, both of Japan

[73] Assignee: Toray Industries, Inc., Tokyo, Japan

[21] Appl. No.: 29,154

[22] Filed: Apr. 11, 1979

[30] Foreign Application Priority Data

Apr. 14, 1978 [JP] Japan .................................. 53-43288

[51] Int. Cl.$^3$ ................................................ G03C 1/68
[52] U.S. Cl. ...................................... 430/281; 430/282; 430/906
[58] Field of Search .................... 96/115 R, 115 P; 430/281, 282, 906

[56] References Cited

U.S. PATENT DOCUMENTS

| | | |
|---|---|---|
| 3,953,877 | 4/1976 | Sigusch et al. .................... 96/115 R |
| 3,957,512 | 5/1976 | Kleeberg ........................... 96/115 R |
| 4,040,831 | 8/1977 | Rubner et al. ..................... 96/115 R |
| 4,139,391 | 2/1979 | Ikeda et al. ....................... 96/115 R |

*Primary Examiner*—Won H. Louie, Jr.
*Attorney, Agent, or Firm*—Miller & Prestia

[57] ABSTRACT

This invention relates to a photosensitive composition comprising a precursor of a heat resistant polymer having carboxylic groups and a compound having a photosensitive olefinic double bond and an amino or quaternary ammonium salt. The photosensitive composition can give highly heat resistant relief patterns with good edge sharpness, good mechanical and chemical properties as well as good insulating properties. The heat resistant relief patterns obtained from the composition of this invention are especially useful as insulating, passivation or protective coatings in semiconductor devices.

14 Claims, No Drawings

PHOTOSENSITIVE COMPOSITIONS

BACKGROUND OF THE INVENTION

This invention relates to a photosensitive composition which can give highly heat-resistant relief structures.

There is an increasing demand for photochemically crosslinkable polymers functioning as insulating, passivation or protective coatings in semiconductor devices. Such film patterns must be resistant to heat and aging while being highly insulating. Frequently a short-term temperature stability of up to 450° C. is required together with an operating temperature of up to 200° C. These requirements cannot be met with current photoresist formulations.

There are a number of soluble precursors which can be converted into highly heat-resistant final products by thermal ring closure reactions. Well known examples of such resistant polymers are the aromatic polyimides developed by DuPont, which have been utilized for years as varnishes and films in the electric and electronics industries.

Methods are known for making relief patterns of highly heat resistant polymers.

Analogous to a metal substrate etching technique, Epifano and Jordan produced patterns of soluble polyimide precursors by use of phototechniques with conventional positive resists. The relief patterns were subsequently converted to polyimide form by heat curing: See German Auslegeschrift DAS No. 1,764,977. In a similar way Jones and Agnihotri produced polyimide film patterns via phototechniques by etching polyimide layers with hydrazine and ethylenediamine respectively: see J. I. Jones, J. Polymer Sci., part C, (22) 773 (1969) and R. K. Agnihotri, Proc. SPE Regional Tech. Conf. Ellenville, N.Y. Oct. 13-15, 74, (1976).

The indirect method of production of film patterns above mentioned is complicated by the additional required steps of producing and removing the photoresist coating. Well defined boundaries between soluble and insoluble regions cannot be produced within the layer of the polyimide precursor.

Photosensitive polyimide precursors are also known. They allow a direct production of film patterns of heat resistant polymers of photochemical means.

Kerwin and Goldrich photosensitized polyimide precursors by the addition of dichromate: see Polymer Engineering and Science 11, 426 (1971). However, their application as a negative photoresist, which is annealed after exposure and development for the preparation of highly heat resistant relief patterns, is limited by the fact that the solution and films of these photosensitized polyaminocarboxylic acids are very unstable and accordingly must be processed immediately after preparation. Furthermore, the highly heat resistant polyimides prepared from the sensitized substances have a considerable content of inorganic salts, which limits their possible applications, particularly as dielectrics in the electronics industry.

It is further known that polyamidecarboxylic acids can be photosensitized by incorporating photosensitive organic residues which are bound to carboxylic groups in the ester fashion: see U.S. Pat. Nos. 3,957,512 and 4,040,831. These photosensitive polyamidecarboxylic acids are also negative working. A typical example of these photosensitive polyamidecarboxylic acids is produced by the following steps:

1st step: Preparation of diallyl ester of pyromellitic acid ($X_1$) from pyromellitic dianhydride.
2nd step: preparation of diallyl ester of pyromellitic acid dichloride ($X_2$) from $X_1$ and thionyl chloride.
3rd step: preparation of a polyimide precursor ($X_3$) from $X_2$ and diaminodiphenylether.
4th step: preparation of a photosensitive polyimide precursor solution from $X_3$, solvent and photoinitiator.

In the 3rd step, the photosensitive polymer $X_3$ is purified by precipitation. As a result of this precipitation purification, the photosensitive prepolymer $X_3$ can be stored in a solid state and has good storage ability. However, the methods of these patents for preparing the photosensitive polyamidecarboxylic acids solution are complicated. The manufacturing cost of the photosensitive compositions is pushed up by these complicated methods.

SUMMARY AND OBJECTS OF THE INVENTION

One object of this invention is to provide a new and more practically useful photosensitive composition which can be annealed to highly heat resistant relief structures after exposure and development. Other objects and advantages of this invention will further become apparent hereinafter.

The invention provides a photosensitive composition comprising (a) a polymer containing repeating units of the formula:

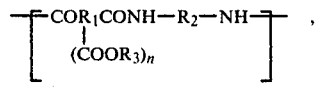

where $R_1$, $R_2$ and $R_3$ will be further described hereinafter, (b) an organic compound having a photo-di- or polymerizable olefinic double bond, and an amino radical or a quaternary ammonium salt.

In preferred embodiments, relatively small amounts (generally less than 5% by weight of the entire system) of a photosensitization material may be added to the composition.

The compositions of the invention are useful in providing coatings that are photocrosslinkable by exposure to actinic light to form a cross-linked layer and which is developed by a developer to form a pattern having clear outlines. The pattern after annealing exhibits excellent insulator properties, heat resistance and good chemical and mechanical properties.

DESCRIPTION OF PREFERRED EMBODIMENTS

This invention provides a photosensitive composition comprising (1) a polymer [I] containing repeating units [II] of the formula

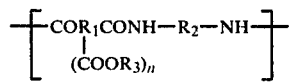

(2) an organic compound [III] having a photo-di- or polymerizable olefinic double bond, and an amino radical or a quaternary ammonium salt.

$R_1$ is an aromatic residue, a preferable example of which is phenylene, a naphthalene residue or a residue of a biphenyl compound of the formula

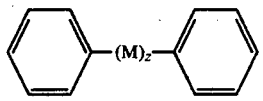

where M is O, $SO_2$, $CH_2$, or CO and z is 0 or 1. An especially preferable example of $R_1$ is a phenylene or benzophenone residue.

$R_2$ is also an aromatic residue, a preferred example of which is a phenylene, a residue of a biphenyl compound of the formula

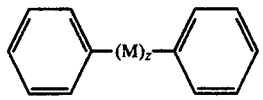

wherein M is O, $SO_2$, $CH_2$ or CO and z is 0 or 1, or a residue of a polyphenyl compound of the formula

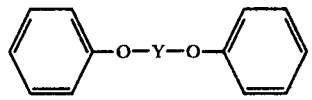

wherein Y is

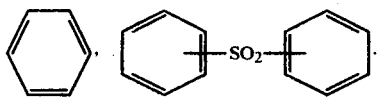

The benzene ring of $R_2$ may contain substituents such as $NH_2$, $CONH_2$, COOH, or $SO_3$. An especially preferred example of $R_2$ is

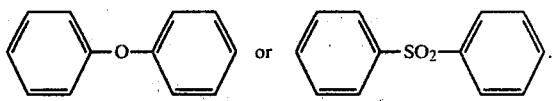

$R_3$ is hydrogen, an alkali metal ion or a substituted or unsubstituted quaternary ammonium ion. Hydrogen is most preferable for use in semiconductor devices which are harmed by alkaline metal impurities.

The group $(COOR_3)_n$ should be located in an ortho or peri position with respect to the amide linkage.

The photosensitive composition can contain a photoinitiator and/or a sensitizer to improve photosensitivity. The composition can further contain photosensitive comonomers capable of copolymerization with the compound [III] for the same purpose.

The polymer [I] is either a homo-or copolymer derived only from repeating units [II] of the formula above illustrated or a copolymer of the repeating units [II] and other repeating units [IV]. In the latter case, to achieve the objects of this invention, the repeating units [IV] must be selected from those which do not degrade the thermostability of the polymer derived from the polymer [I] by heat curing. Examples of the repeating units [IV] are shown in "Journal of the Japan Petroleum Institute" 17, 110–120 (1974).

One example of copolymer consisting of repeating unit [II] and repeating unit [IV] is

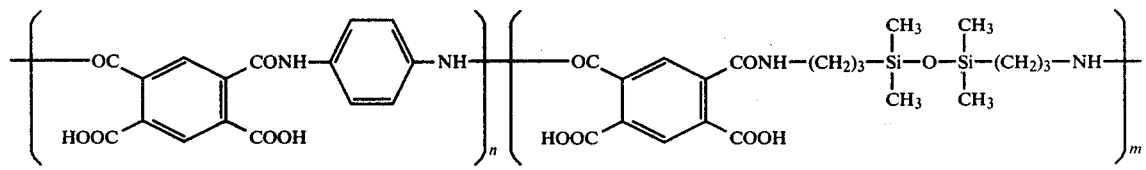

repeating unit [II]   repeating unit [IV]

Especially preferred examples of the polymer [I] are polyamide acids or polyamideamide acids, some of which are as follows:

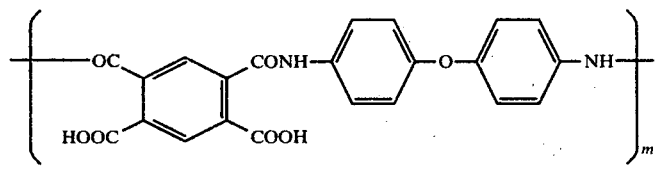

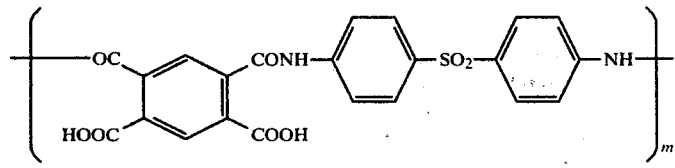

-continued

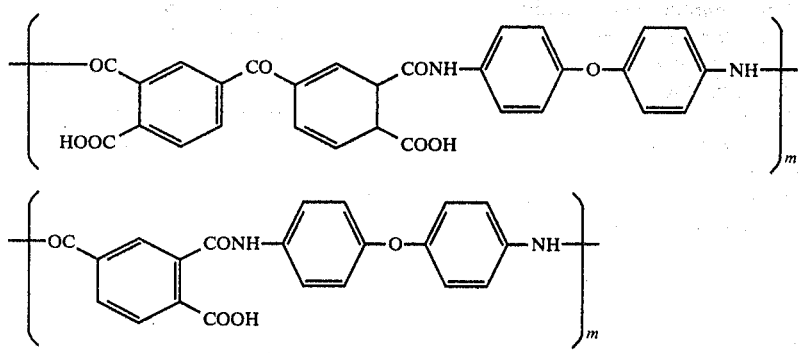

The organic compound [III] has both a photo-di- or polymerizable olefinic double bond and an amino radical or a quaternary ammonium salt. Examples of the organic compound [III] are as follows

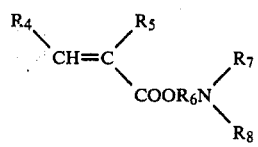

wherein $R_4$ is hydrogen or phenyl, $R_5$ is hydrogen or alkyl having 1 to 2 carbon atoms, $R_6$ is an alkylene having 2 to 4 carbon atoms, and each of $R_7$ and $R_8$ is an alkyl having 1 to 3 carbon atoms, or

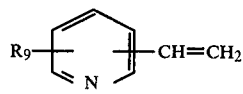

wherein $R_9$ is hydrogen or alkyl having 1 to 2 carbon atoms, or

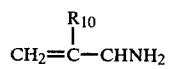

wherein $R_{10}$ is hydrogen or methyl, or quaternary salts of these compounds, or mixtures thereof.

Another examples of the compound [III] are 2-vinylquinoline, 4-vinylquinoline, allyltriethylammonium chloride, 1-allylimidazole, 2-isopropenylimidazole, 1-vinylimidazole, 1-methallylimidazole, 1-allylbenzimidazole, 2-vinylimidazole, 1-methallylbenzimidazole, 1-vinylpyrazole, 1-allylpyrazole, 1-methallylpyrazole, 1-vinylpyrole, 2-methyl-5-vinylpyrole, 2-morphalino-ethylacrylate, 4,6-dimethyl-2-vinylpyridine.

Preferred examples of the organic compounds [III] are diethylaminoethylmethacrylate, diethylaminoethylacrylate, dimethylaminoethylmethacrylate, dimethylaminoethylacrylate, 2-vinylpyridine, 2-methyl-5-vinylpyridine, allylamine and methallylamine. From the viewpoint of photosensivity, acrylic esters or methacrylic esters are especially preferable.

In the case of a compound [III] having an amino radical and an olefinic double bond, it is desirable to combine the compound [III] with a polymer [I] in which $R_3$ of the repeating unit [II] is hydrogen. In the case of a compound [III] having a quaternary ammonium salt and an olefinic double bond, it is preferable to combine the compound [III] with a polymer [I] in which $R_3$ of the repeating unit [II] is an alkali metal ion or an ammonium ion. In the latter case, an alkali metal chloride such as sodium chloride or potassium chloride may precipitate in the photosensitive composition solution. It is desirable to exclude such a precipitant by filtration or by other methods.

The ratio of the compound [III] to the polymer [I] must meet the following conditions:

(1) the mol ratio of the compound [III] to the repeating units of the polymer [I] including repeating units [II] and repeating units [IV] must be equal to or greater than 0.05, preferably equal to or greater than 0.3.

(2) The mol ratio of the compound [III] to $COOR_3$ in the polymer [I] must be equal to or less than 2.0. The compositions which satisfy these conditions have good photosensitivity and are responsive to development.

The photosensitive composition of this invention is usually prepared initially as a solution. From the viewpoint of solubility, the preferred solvents used to prepare the solutions of this composition are polar, typical examples of which are N-methyl-2-pyrrolidone, N,N-dimethylformamide, N,N-dimethylacetamide, dimethylsulfoxide and hexamethylphosphoramide.

The photoinitiators and/or sensitizers which can be employed in this invention to improve photosensitivity can be chosen from those listed in "Light Sensitive Systems" by J. Kosar, John Wiley & Sons, Inc., N.Y., 1965, pp. 143 to 146 and pp. 160 to 188. Highly suited sensitizers and initiators are, for instance, Michler's ketone, benzoin ether, 2-tertiarybutyl-9, 10-anthraquinone, 1,2-benz-9,10-anthraquinone and 4, 4'-bis(diethylamino) benzophenone.

Preferred examples of photosensitive comonomers capable of copolymerization with the compound [III] are maleimides such as N-phenylmaleimide, diphenylmethanedimaleimide and diphenyletherdimaleimide, for example.

The photosensitive composition of this invention can be processed into a highly heat resistant relief pattern by well-known photoresist patterning techniques. A solution of the photosensitive composition can be coated on a substrate as a uniform film having excellent mechanical properties and, in most cases, good adhesion. This film can be exposed to actinic light such as ultraviolet light through a negative photomask and then developed into a relief pattern using a developer which dissolves the unexposed portions. The relief pattern thus obtained which is made of a precursor of a heat stable polymer can be transformed by heat curing into a highly thermal stable polymer pattern with a heat stable imide or other ring structure.

One example of the developers is a mixture of a solvent of the photosensitive composition of this invention such as N,N-dimethylformamide, dimethylsulfoxide, N,N-dimethylacetamide, N-methyl-2-pyrrolidone or hexamethylphosphoramide and a non-solvent of the composition such as methanol or ethanol. Another example of the developers is an aqueous alkaline solution such as an aqueous solution of ammonia, sodium hydroxide or potassium hydroxide. Further examples of the developers include the solvents of the compositions themselves above mentioned.

The adhesion of the generated relief patterns of the compound of this invention to various substrates can further be improved by adding common adhesion promoters such as, for instance, γ-aminopropyltrimethoxysilane, γ-glycidoxypropyltrimethoxysilane, aluminum acetylacetonate, titanium acetylacetonate or zirconium acetylacetonate.

The relief patterns of the composition of this invention obtained by the method above mentioned have good edge sharpness, high temperature resistance and excellent insulating, chemical and mechanical properties. It is easier to obtain a pattern free from alkali metal ions such as sodium or potassium which have undesirable effects upon semiconductors.

Thus, the photosensitive composition of this invention can be used for the preparation of passivating layers or insulating layers on semiconductor devices, of solder protecting layers, of miniaturized layer circuits, of printed circuits of electro-deposited conductors, of masks for ion implantation or vapor-deposition of metals or inorganic compounds which need high temperature vaporization and of lift-off pattern layers as well as of etch resists or plating resists, preferably without subsequent annealing.

The invention will now be further illustrated by, but is not intended to be limited to, the following detailed Examples.

EXAMPLE 1

4,4'-diaminodiphenylether (110 g) was dissolved in 278 g of N-methyl-2-pyrrolidone (amine solution). Pyromellitic dianhydride 120 g was dissolved in a mixture of dimethylacetamide (308 g) and N-methyl-2-pyrrolidone (acid solution). The amine solution was added to the acid solution with stirring and then stirring was continued at 60° C. for 3 hours. A polymer solution (A) of 60 poise (at 30° C.) was obtained.

The polymer solution (A) 50 g, Michler's ketone 1.15 g was dissolved in 30 g. of dimethylacetamide and diethylaminoethylmethacrylate (10.2 g) dissolved in 10 g of dimethylacetamide were mixed and filtered.

The photosensitive solution thus obtained was coated on an aluminum foil by a spinner. The coated film was dried at 100° C. for 5 minutes. The film was 3μ thick after evaporation of the solvent and exhibited excellent mechanical properties with excellent adhesion to the substrate. The film was irradiated with a 500 W high pressure mercury lamp at a distance of 23 cm through a mask having a stripe pattern for 10 minutes, and was then developed by a developer consisting of a 5:2 mixture of dimethylformamide and methanol. The film was cured at 350° C. for 5 minutes to form a heat resistant relief pattern which maintained its edge sharpness and weight after heat treatment at 200° C. for 1 hour.

The photosensitive solution maintained its photosensitivity after six months' storage at 0° C.

The metal contents in the photosensitive solution were as follows.

| | |
|---|---|
| Na | 0.5 ppm |
| K | <0.5 ppm |
| Fe | 0.9 ppm |
| Ca | 0.4 ppm |
| Mg | 0.1 ppm |
| Cu | <0.1 ppm |

EXAMPLE 2

50 g of the polymer solution (A) obtained as described in Example 1, Michler's ketone 1.15 g dissolved in 30 g dimethylacetamide, diethylaminoethylmethacrylate (10.2 g) dissolved in 10 g of dimethylacetamide and phenylmaleimide 1.15 g were mixed and then filtered.

The photosensitive solution thus obtained was converted to a relief pattern using the same method described in Example 1. The relief pattern had good edge sharpness and heat resistance.

EXAMPLE 3

50 g of the polymer solution (A) obtained as described in Example 1, Michler's ketone (1.15 g) dissolved in 30 g of dimethylacetamide, diethylaminoethylmethacrylate (10.2 g) in 10 g of dimethylacetamide and phenylmaleimide (1.15 g) were mixed and then filtered.

The photosensitive solution obtained was converted to a relief pattern using the same method described in Example 1 except using N-methyl-2-pyrrolidone as a developer instead of the mixture of dimethylformamide and methanol. The relief pattern had good edge sharpness and heat resistance.

EXAMPLE 4

50 g of the polymer solution (A) obtained as described in Example 1, Michler's ketone (1.15 g) dissolved in 30 g of dimethylacetamide, dimethylaminoethylacrylate (7.9 g) dissolved in 10 g of dimethylacetamide and phenylmaleimide (1.15 g) were mixed and then filtered.

The photosensitive solution obtained was converted to a relief pattern using the same method described in Example 1 except using an 8:2 mixture of dimethylacetamide and methanol as a developer instead of the mixture of dimethylformamide and methanol. The relief pattern obtained had good edge sharpness and heat resistance.

EXAMPLE 5

Diaminodiphenylether (53.6 g) was dissolved in a solvent mixture of dimethylacetamide (445 L g) and N-methyl-2-pyrrolidone (445 g). Propylene oxide (31.1 g) was added to this solution.

Trimellitic anhydride chloride (56.4 g) was added portionwise to the solution cooled to −10° C. After addition, the reaction mixture was further stirred for 3 hours at room temperature. A polymer solutin (B) of 10 poise (at 30° C.) was obtained.

The polymer solution (B) (50 g), Michler's ketone (0.55 g) dissolved in 11 g of dimethylacetamide, diethylaminoethylacrylate (2.7 g) and phenylmaleimide (0.55 g) were mixed and filtered.

The photosensitive solution thus obtained was converted to a relief pattern using the method described in Example 1 except that an 8:2 mixture of dimethylacetamide and methanol was substituted for the 5:2 mixture of dimethylformamide and methanol.

The relief pattern obtained had good edge sharpness and heat resistance.

EXAMPLE 6

4,4'-diaminodiphenylether (110 g) was dissolved in a solvent mixture of N-methyl-2-pyrrolidone (500 g) and dimethylacetamide (500 g). Pyromellitic dianhydride (120 g) was added portionwise with agitation without allowing the reaction mixture temperature to rise above 30° C. After the addition the reaction mixture was further stirred for 3 hours at 20° C. and then diluted by a solvent mixture of N-methyl-2-pyrrolidone (421 g) and dimethylacetamide (421 g). A polymer solution (C) of 20 poise (at 30° C.) was obtained.

The solution (C) (50 g), 2-vinylpyridine (2.77 g), and Michler's ketone (0.55 g) dissolved in 6 g of dimethylacetamide were mixed and filtered.

The photosensitive solution thus obtained was coated on aluminum foil to make a uniform film by use of a spinner. The film was 5μ thick after drying at 100° C. for 2 minutes. The film was irradiated using the same conditions as described in Example 1 and was developed by a developer of 1.4% aqueous ammonia solution.

The sample obtained was cured for 10 minutes at 200° C. and then for 5 minutes at 350° C. The relief pattern thus obtained had good edge sharpness and heat resistance.

EXAMPLE 7

50 g of the solution (C) obtained as described in Example 6, Michler's ketone (0.55 g) dissolved in 6 g of dimethylacetamide and trimethyl (β-methacryloilethyl) ammonium chloride (4.62 g) dissolved in 10 g of 1:1 solvent mixture of methanol and dimethylacetamide were mixed and filtered.

The photosensitive solution thus obtained was processed into a relief pattern as described in Example 6 except that 0.14% aqueous ammonia solution was substituted for the 1.4% aqueous ammonia solution as the developer. The relief pattern had good edge sharpness and heat resistance.

EXAMPLE 8

50 g of the solution (C) obtained as described in Example 6, allylamine (2.56 g) dissolved in 9 g of a 4:5 mixture of distilled water and dimethylacetamide and phenylmaleimide (0.55 g) and Michler's ketone (0.55 g) both dissolved in 6 g of dimethylacetamide were mixed and filtered.

The photosensitive solution was coated on an aluminum foil and irradiated as described in Example 6. The irradiated film was developed by N-methyl-2-pyrrolidone. The relief pattern obtained was cured for 10 minutes at 200° C. and then for 5 minutes at 350° C. It had good edge sharpness and heat resistance.

EXAMPLE 9

4,4'-diaminodiphenylether (100.1 g) was dissolved in 1,480 g of N-methyl-2-pyrrolidone. 3,3', 4,4'-benzophenonetetracarboxylic acid dianhydride (161.1 g) was added portionwise to the solution cooled to 10° C. After the addition, the reaction mixture was further stirred for 2 hours at 55° C., then cooled to 30° C. Dimethylaminoethylmethacrylate (157.3 g) and Michler's ketone (13.1 g) both dissolved in 463 g of N-methyl-2-pyrrolidone were added to the solution. The photosensitive solution obtained had a viscosity of 11 poise at 30° C.

An 0.5% solution of γ-aminopropyltrimethoxysilane was coated on a silicon wafer having an oxidized surface by means of a spinner. The silicon wafer was dried at 150° C. for 30 minutes. The photosensitive solution was coated on the silicon wafer by means of a spinner to make a uniform film. The film was 4μ thick after evaporation of solvent. The film was irradiated with a 500 W high pressure mercury lamp at a distance of 23 cm through a mask having a stripe pattern for 10 minutes, then developed by a developer of a 5:3:2 solvent mixture of dimethylacetamide, methanol and isopropanol. The relief pattern obtained was cured at 150° C., 300° C. and 350° C. successively each for 30 minutes. The relief pattern after curing had good edge sharpness. It also had better adhesion than without the use of the adhesion promoter γ-aminopropyltrimethoxysilane.

EXAMPLE 10

50 g of the polymer solution (A) obtained as described in Example 1, Michler's ketone 1.15 g dissolved in 30 g of dimethylacetamide and 2-methyl-5-vinylpyridine 8.0 g dissolved in 10 g of dimethylacetamide were mixed and then filtered.

The photosensitive solution obtained was converted to a relief pattern using the same method described in Example 1. The relief pattern obtained had good edge sharpness and heat resistance.

EXAMPLE 11

50 g of the polymer solution (A) obtained as described in Example 1, Michler's ketone 1.15 g dissolved in 30 g of dimethylacetamide and methallylamine 4.0 g dissolved in 10 g of dimethylacetamide were mixed and then filtered.

The photosensitive solution obtained was converted to a relief pattern using the same method described in Example 1. The relief pattern obtained had good edge sharpness and heat resistance.

We claim:

1. A photosensitive composition comprising
   (1) a polymer [I] containing a repeating unit [II] of the formula

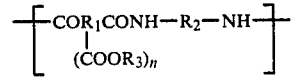

wherein $R_1$ and $R_2$ each comprise a carbocyclic or heterocyclic nucleus; $R_3$ is selected from the group consisting of hydrogen, an alkali metal ion and an ammonium ion; n is 1 or 2, and $COOR_3$ is located in an ortho or peri position with respect to the amide linkage.
   (2) an organic compound [III] having a photo- di- or polymerizable olefinic double bond and an amino radical or a quaternary ammonium salt.

2. The composition of claim 1 further including a photoinitiator and/or a photosensitizer.

3. The composition of claim 1, in which the polymer [I] contains two or more different repeating units.

4. The composition of claim 1, in which the polymer [I] is polyimide precursor.

5. The composition of claim 1; in which $R_1$ is selected from the group consisting of phenylene, naphthalene and biphenyl of the formula

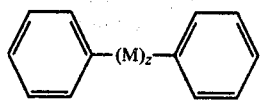

where M represents O, $SO_2$, $CH_2$ or CO and z is 0 or 1.

6. The composition of claim 1, in which $R_1$ is selected from the group consisting of phenylene and benzophenone.

7. The composition of claim 1, in which $R_2$ is selected from the group consisting of phenylene, diphenylether, diphenylmethane and diphenylsulfone.

8. The composition of claim 1, in which the organic compound [III] is

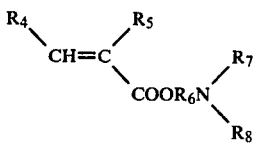

wherein $R_4$ is hydrogen or phenyl; $R_5$ is hydrogen or alkyl having 1 to 2 carbon atoms; $R_6$ is an unsubstituted or substituted hydrocarbon radical having 2 to 4 carbon atoms; and each of $R_7$ and $R_8$ is alkyl having 1 to 3 carbon atoms.

9. The composition of claim 1, in which the organic compound [III] is

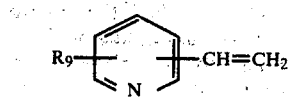

wherein $R_9$ is hydrogen or alkyl having 1 to 2 carbon atoms.

10. The composition of claim 1, in which the organic compound [III] is

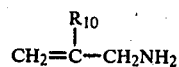

wherein $R_{10}$ is hydrogen or $CH_3$.

11. The composition of claim 2, in which the photoinitiator and/or the photosensitizer is selected from the group consisting of Michler's ketone, benzoin ether and 2-tertiarybutyl-9, 10-anthraquinone.

12. The composition of claim 6, in which $R_2$ is diphenylether.

13. The composition of claim 11, in which the photoinitiator is Michler's ketone.

14. The composition of claim 1, wherein compound [III] is selected from the group consisting of diethylaminoethylmethacrylate, diethylaminoethylacrylate, dimethylaminoethylmethacrylate, dimethylaminoethylacrylate, 2-vinylpyridine, 2-methyl-5-vinylpyridine, allylamine and methallyamine.

* * * * *